United States Patent
Fischer et al.

(10) Patent No.: US 11,087,957 B2
(45) Date of Patent: Aug. 10, 2021

(54) METHOD OF OPERATING A PARTICLE BEAM SYSTEM, PARTICLE BEAM SYSTEM AND COMPUTER PROGRAM PRODUCT

(71) Applicants: Carl Zeiss SMT GmbH, Oberkochen (DE); Carl Zeiss Microscopy GmbH, Jena (DE)

(72) Inventors: Daniel Fischer, Dresden (DE); Josef Biberger, Wildenberg (DE); Pedro Besteiro, Póvoa de Varzim (PT)

(73) Assignees: Carl Zeiss SMT GmbH, Oberkochen (DE); Carl Zeiss Microscopy GmbH, Jena (DE)

( * ) Notice: Subject to any disclaimer, the term of this patent is extended or adjusted under 35 U.S.C. 154(b) by 29 days.

(21) Appl. No.: 16/744,517

(22) Filed: Jan. 16, 2020

(65) Prior Publication Data
US 2020/0234913 A1    Jul. 23, 2020

(30) Foreign Application Priority Data

Jan. 17, 2019   (DE) .................. 10 2019 101 155.8

(51) Int. Cl.
| | | |
|---|---|---|
| *H01J 37/26* | (2006.01) | |
| *H01J 37/28* | (2006.01) | |
| *H01J 37/244* | (2006.01) | |

(52) U.S. Cl.
CPC .......... *H01J 37/265* (2013.01); *H01J 37/244* (2013.01); *H01J 37/28* (2013.01); *H01J 2237/2448* (2013.01)

(58) Field of Classification Search
CPC ............... H01J 37/28; H01J 37/265; H01J 2237/24495; H01J 37/20; H01J 37/222;
(Continued)

(56) References Cited

U.S. PATENT DOCUMENTS 3,922,546 A    11/1975   Livesay
10,361,061 B2 *  7/2019   Kondo .................... H01J 37/28
(Continued)

FOREIGN PATENT DOCUMENTS

DE    11 2008 000 170 T5    11/2009
JP    2016-085966 A    5/2016

OTHER PUBLICATIONS

German Office Action, with translation thereof, for corresponding DE application No. 10 2019 101 155.8 dated Aug. 23, 2019.

*Primary Examiner* — David A Vanore
(74) *Attorney, Agent, or Firm* — Fish & Richardson P.C.

(57) ABSTRACT

A method of operating a particle beam microscope includes repeating a sequence to move a particle beam across a surface of an object. The surface of the object has a region defined by a closed boundary line. The sequence includes moving the particle beam from an entry location of the present sequence to an exit location of the present sequence along a scan path. The entry location of the present sequence and the exit location of the present sequence are located on the boundary line. The scan path is located entirely inside the region of the surface of the object. The sequence also includes moving the particle beam from the exit location of the present sequence to an entry location of the next sequence along a return path. The entry location of the next sequence is located on the boundary line. The return path is located entirely outside the region of the surface of the object.

20 Claims, 6 Drawing Sheets

(58) Field of Classification Search
CPC .............. H01J 37/26; H01J 2237/0432; H01J 2237/15; H01J 2237/20007; H01J 2237/20221; H01J 2237/24585; H01J 2237/28; H01J 2237/2803; H01J 2237/30488; H01J 37/1474; H01J 37/244; H01J 2237/2448; H01J 37/1472
USPC .............................. 250/307, 310, 311, 396 R
See application file for complete search history.

(56) References Cited

U.S. PATENT DOCUMENTS

| | | | |
|---|---|---|---|
| 10,796,881 B2 * | 10/2020 | Stegmann | H01J 37/28 |
| 10,937,625 B2 * | 3/2021 | Franken | H01J 37/26 |
| 2008/0224039 A1 * | 9/2008 | Nakamura | G01B 15/00 |
| | | | 250/310 |
| 2009/0224169 A1 * | 9/2009 | Sawada | H01J 37/153 |
| | | | 250/396 R |
| 2012/0261586 A1 * | 10/2012 | Knippels | H01J 37/045 |
| | | | 250/396 R |
| 2015/0243474 A1 * | 8/2015 | Lazic | H01J 37/244 |
| | | | 250/307 |
| 2016/0118219 A1 * | 4/2016 | Potocek | H01J 37/28 |
| | | | 250/307 |
| 2016/0307729 A1 * | 10/2016 | Lazic | H01J 37/28 |

* cited by examiner

METHOD OF OPERATING A PARTICLE BEAM SYSTEM, PARTICLE BEAM SYSTEM AND COMPUTER PROGRAM PRODUCT

CROSS-REFERENCE TO RELATED APPLICATIONS

The present application claims benefit under 35 USC 119 of German Application No. 10 2019 101 155.8, filed Jan. 17, 2019. The entire disclosure of this application is incorporated by reference herein.

FIELD

The present disclosure relates to a method of operating a particle beam system, in particular of a particle beam microscope, as well as a particle beam system and a particle beam microscope, respectively, configured to perform the method, as well as a computer program product.

BACKGROUND

In conventional particle beam systems the particle beam generated by the particle beam system is moved line by line across a region of an object to be analyzed and/or processed. When the particle beam has arrived at the end of such a line, the particle beam should be returned, i.e., moved to the beginning of a new line. Conventionally, the particle beam is moved across the region during return. The particle beam striking the object during the return from an end of a line to the beginning of a next line can have negative influences on the object. For example, charge can be deposited or generated in the object which negatively affects the precision of the beam movement in the next line. Further, impurities or structural damage of the object can be caused.

In order to prevent these negative influences, so-called particle beam blankers can be used which can interrupt the particle beam so that the particle beam does not strike the object during the return. However, such particle beam blankers involve control effort not to be neglected and involve significant costs.

SUMMARY

The present disclosure seeks to provide a particle beam system, in particular a particle beam microscope, as well as a method of operating the particle beam system which can avoid or at least diminish the above-mentioned negative influences generated on return of the particle beam by a relatively simple and cost-efficient approach.

One aspect of the present disclosure relates to a method of operating a particle beam microscope, wherein the method includes: repeating a sequence to move a particle beam across a surface of an object, the object having, on the surface, a region defined by a virtual closed boundary line, wherein the sequence includes: moving the particle beam from an entry location of the present sequence to an exit location of the present sequence along a scan path, wherein the entry location of the present sequence and the exit location of the present sequence are located on the boundary line and wherein the scan path is located entirely inside the region, and moving the particle beam from the exit location of the present sequence to an entry location of the next sequence along a return path, wherein the entry location of the next sequence is located on the boundary line and wherein the return path is located entirely outside the region.

According to this method, the particle beam generated by the particle beam microscope is moved across the surface of the object which means that the particle beam continuously, i.e., uninterruptedly, strikes the surface of the object during the moving. In particular, the particle beam is not interrupted by a particle beam blanker during the moving. The particle beam can be formed by ions or electrons.

By interaction of the particle beam with the object secondary particles are generated. Secondary particles can refer to secondary electrons, backscattered electrons secondary ions or backscattered ions, for example. Secondary particles can also refer to the particles of a secondary radiation generated by interaction of the particle beam with the object. Secondary radiation can refer to X-rays or cathodoluminescence, for example.

The region defined by the closed boundary line is a region of the object to be analyzed and/or processed. For this, the particle beam is directed onto the region. For example, an image of this region is to be recorded. Further or alternatively, the object is to be processed by depositing material on the object or by removing material from the object.

The boundary line is a closed line that encloses the region. The boundary line is virtual which means that the boundary line is not a structural feature of (the surface) of the object. The region can have a rectangular shape, for example. Accordingly, the boundary line can have the shape of the boundary of a rectangular shape.

The method includes repeating a sequence. Each sequence includes a first phase and a second phase.

In the first phase of each sequence, the particle beam is moved from the entry location of this sequence to the exit location of this sequence along a path that is located entirely inside the region, the path being referred to as scan path. This means that the scan paths can also (partially) coincide with the boundary line.

In the second phase of each sequence which succeeds the first phase of this sequence, the particle beam is moved from the exit location of this sequence to the entry location of the next sequence which is referred to as return. In order to avoid negative influences on the region defined by the closed boundary line, the particle beam is returned along a path which is located entirely outside the region, the path being referred to as return path.

Each of the sequences has exactly one entry location and exactly one exit location. The entry locations and exit locations of all sequences are located on the boundary line and, in general, are different locations on the surface of the object. The entry location is a location on the boundary line to which the particle beam is directed at the beginning of a sequence. This sequence ends in that the particle beam has been moved to the entry location of the next sequence.

The secondary particles generated during the moving of the particle beam along the scan path can be used for generating data forming the basis of the analysis and/or processing of the region. For example, the data can represent an image of the region.

For example, the scan path is a "straight", i.e., a substantially straight line. In contrast, the return path is generally not a straight line because each return path runs at least partially around the closed region.

The sequence is repeated in time in order to move the particle beam little by little, i.e., scan path by scan path, across the entire region to be analyzed and/or processed.

According to an embodiment, the particle beam continuously strikes the surface of the object for the duration of each sequence. Accordingly, the particle beam strikes the surface of the object during the moving of the particle beam along the scan paths as well as during the moving of the particle beam along the return paths. Consequently, the particle beam system does not need to have a particle beam blanker.

According to another embodiment, each of the return paths of the sequences includes a return path section included in all of the return paths. The length of the return path section amounts to at least 30% or at least 50% of the length of the shortest return path or at least 30% or at least 50% of the length of the shortest scan path of the sequences, for example.

In this embodiment, the particle beam is moved along the return path section during the return in each sequence. The effect is that a small as possible portion of the surface of the object is struck by the particle beam during the return. Therefore, the negative influences caused by the return are limited to a small portion of the surface of the object, the portion being located entirely outside the region.

According to another embodiment, the region defined by the closed boundary line is rectangular. However, the region can also have a different shape. Further, the region can have an area of at least $(100 \text{ nm})^2$ or at least $(1 \text{ µm})^2$. Accordingly, the region includes a significantly large area of the surface of the object.

According to another embodiment, the entry location and the exit location assigned to a sequence (i.e., an entry location and an exit location of the same sequence) are separated by a distance of at least 50 nm, in particular at least 100 nm, further in particular at least 200 nm. Effectively, a minimum length of each of the scan paths is thereby defined which amounts to at least 50 nm, in particular at least 100 nm, further in particular at least 200 nm.

According to another embodiment, a distance between entry locations located directly adjacent to each other on the boundary line amounts to at most 200 nm, in particular at most 100 nm, further in particular at most 10 nm. The smaller the distance between the entry locations located directly adjacent to each other on the boundary line, the better can the region be analyzed and/or processed.

According to another embodiment, a distance between exit locations located directly adjacent to each other on the boundary line amounts to at most 200 nm, in particular at most 100 nm, further in particular at most 10 nm. The smaller the distance between the exit locations located directly adjacent to each other on the boundary line, the better can the region be analyzed and/or processed.

According to another embodiment, the boundary line has a first uninterrupted section, in which the entry locations are located, and a second uninterrupted section, in which the exit locations are located, wherein the first uninterrupted section and the second uninterrupted section do not overlap. Accordingly, the entry locations and the exit locations are collectively separated from each other. For example, the region is rectangular and the boundary line therefore has two long sides and two short sides. For example, the first uninterrupted section is formed by one of the two long sides and the second uninterrupted section is formed by the other one of the two long sides. Therefore, the first and second sections do not overlap. This corresponds to a line by line beam movement wherein each line begins on the same side of the region, for example.

According to another exemplary embodiment, the scan paths are substantially straight lines. "Substantially straight" is a line that is to be performed as a straight line by the particle beam system, that, however, is not performed as a perfectly straight line due to the finite precision of the particle beam system and external influences. The scan paths of each sequence can have the same shape, i.e., be substantially straight lines, for example. However, the scan paths can also have a different shape.

According to another embodiment, a mean value of the lengths of the scan paths is less than a mean value of the lengths of the return paths. According to an alternative embodiment, a mean value of the lengths of the scan paths is greater than a mean value of the lengths of the return paths. The mean value is the arithmetic mean value or the median, for example.

According to another embodiment, the method further includes: defining the region; generating control signals for a deflection system of the particle beam system based on the defined region; wherein the moving of the particle beam is effected by the deflection system.

In practice, the region and the closed boundary line defining it are defined by definition by a user of the particle beam system. By the definition of the region, a portion of the surface of the object is determined that is to be analyzed and/or processed using the particle beam system. Based on the defined region, a controller of the particle beam system can generate control signals controlling the deflection system which, in turn, deflects the particle beam in dependence of the control signals and thereby effects the moving of the particle beam across the surface of the object.

According to another embodiment, the method further includes: detecting secondary particles generated by interaction of the particle beam with the object; generating a detection signal representing the amount and/or the energy of the detected secondary particles in dependence of time; and in particular generating data representing an image of the region based on the detection signal. The detecting of the secondary particles and/or the generating of the detection signal can be performed for the duration of each sequence. In particular, only such a portion of the detection signal is processed further that is caused by secondary particles which were generated when the particle beam struck the region defined by the closed boundary line.

In this embodiment, a detector of the particle beam system is configured to detect the secondary particles generated by interaction of the particle beam with the object. The particles are detected for the duration of each sequence, i.e., continuously from the beginning of a sequence to the end of this sequence. Also, the detection signal is generated for the duration of each sequence, i.e., continuously from the beginning of a sequence to the end of this sequence. Accordingly, the detection signal is a continuous data stream representing the amount and/or energy of the detected secondary particles in dependence of time. Based on the detection signal, data can be generated that forms the basis for an analysis and/or processing of the region. For example, the data can represent an image of the region. In order to generate the data such portions are extracted from the detection signal that are caused by secondary particles that were generated when the particle beam was moved along a scan path (and not along a return path). This can be performed by the controller of the particle beam system.

According to another embodiment, the particle beam rests at a plurality of rest locations, each time for a predetermined rest duration, during the moving of the particle beam along the scan paths. This corresponds to a "rasterized scanning" of the region. By this, the particle beam is directed in time one after another to a limited amount of discrete locations on a scan path (rest locations) and rests there for the predetermined rest duration.

According to another embodiment, the particle beam is continuously moved during the moving of the particle beam along the scan paths. In particular, the particle beam can be moved with a substantially constant velocity during the moving along the scan paths. This principle is the counterpart to the "rasterized scanning" because the particle beam is moved continuously with a substantially constant velocity and does not rest for a predetermined rest duration at the same location.

According to another embodiment, the moving of the particle beam from the exit location of the present sequence to the entry location of the next sequence includes a waiting step before reaching the entry location of the next sequence, wherein the particle beam rests for the duration of the waiting step at substantially the same location.

Electronic components of the particle beam microscope used for moving the particle beam may cause a damped oscillation of the location of incidence of the particle beam onto the object. For this damped oscillation to be sufficiently damped before the particle beam is moved along a scan path, the particle beam rests during the return for the duration of the waiting step at the substantially same location. The location of incidence changes basically only because of the damped oscillation. Generally, this location is in proximity of the entry location of the next sequence.

BRIEF DESCRIPTION OF THE DRAWINGS

Embodiments of the disclosure are subsequently described with reference to figures.

DETAILED DESCRIPTION

Figure 1:
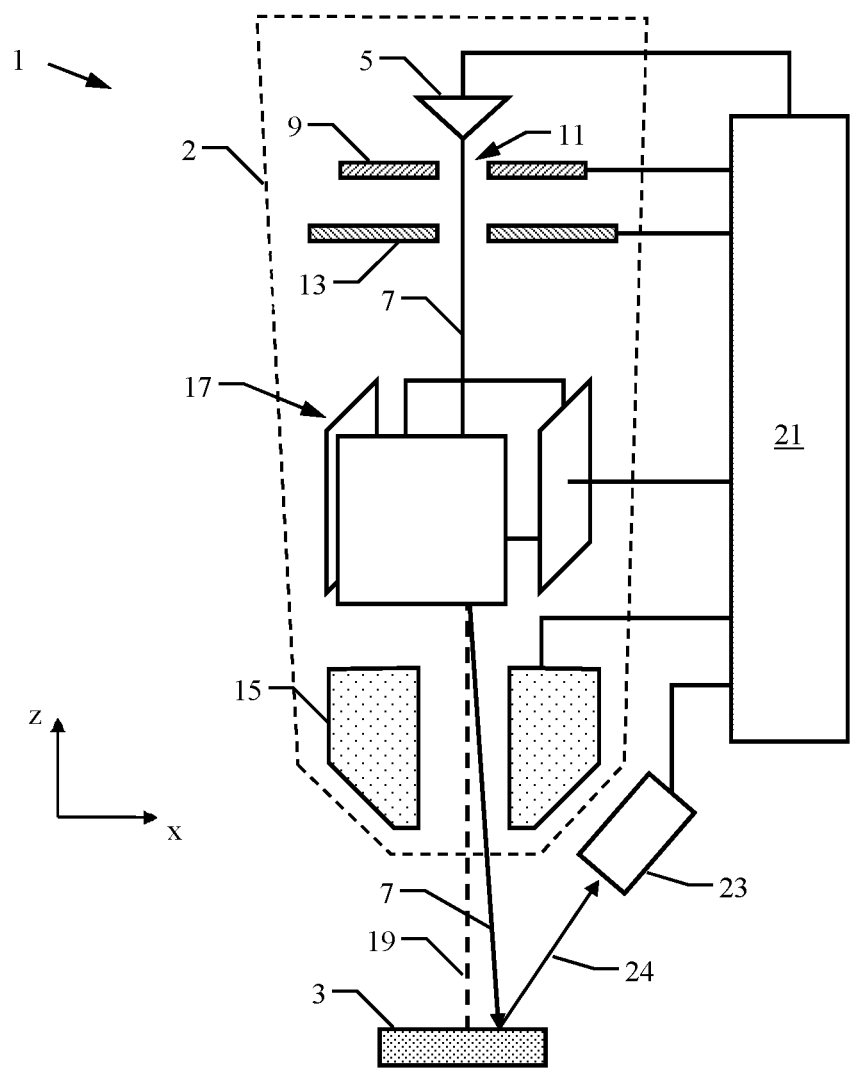
FIG. 1 shows an exemplary particle beam system.

FIG. 1 shows an exemplary particle beam system 1 suitable for performing the methods described herein, in particular suitable for analyzing and/or processing an object 3. The particle beam system 1 can be a particle beam microscope, for example.

The particle beam system 1 includes a particle beam column 2. The particle beam column 2 includes a particle source 5 configured to generate a particle beam 7. The particle beam 7 is formed from electrons or ions, for example.

The particle beam column 2 further includes a suppression electrode 9 to which an electric potential can be applied so that only such particles generated by the particle source 5 having a sufficiently large kinetic energy can pass through an opening 11 in the suppression electrode 9.

The particle beam column 2 further includes an acceleration electrode 13 to which an electric potential is applied to accelerate the particles passing the opening 11 of the suppression electrode 9 to a predetermined kinetic energy.

The particle beam column 2 further includes a particle optical lens 15 suitable for focusing the particle beam 7.

The particle beam column 2 further includes a deflection system 17 suitable for deflecting the particle beam 7 so that the particle beam 7 can be directed to different locations on the surface of the object 3. The deflection system 17 can be suited to deflect the particle beam 7 along two directions oriented orthogonal to each other, the two directions further being oriented orthogonal to a main axis 19 of the particle optical lens 15.

The particle beam system 1 further includes a controller 21 suited to control the particle beam column 2. The controller 21 is configured to control the particle source 5, the electric potential applied to the suppression electrode 9, the electric potential applied to the acceleration electrode 13, the deflection system 17 and the particle optical lens 15.

The particle beam system 1 further includes a detector 23 suited to detect secondary particles 24 generated by interaction of the particle beam 7 with the object 3. The detector 23 can be disposed outside or inside the particle beam column 2.

The detector 23 is suited to output a detection signal representing the amount and/or energy of the detected secondary particles in dependence of time. The controller 21 can receive and process the detection signal of the detector 23.

Figure 2:
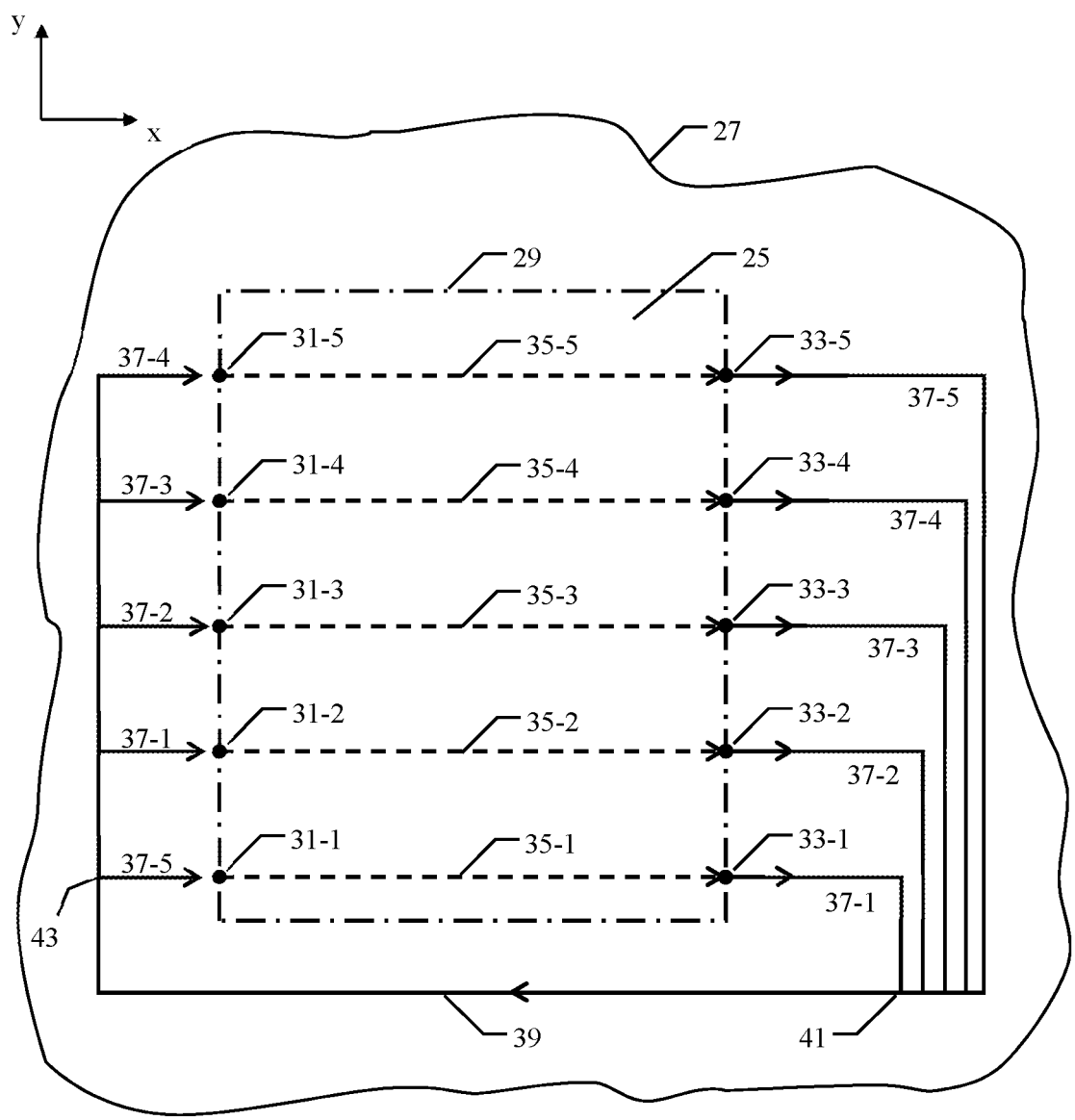
FIG. 2 shows the moving of a particle beam on a surface of an object.
Figure 3:
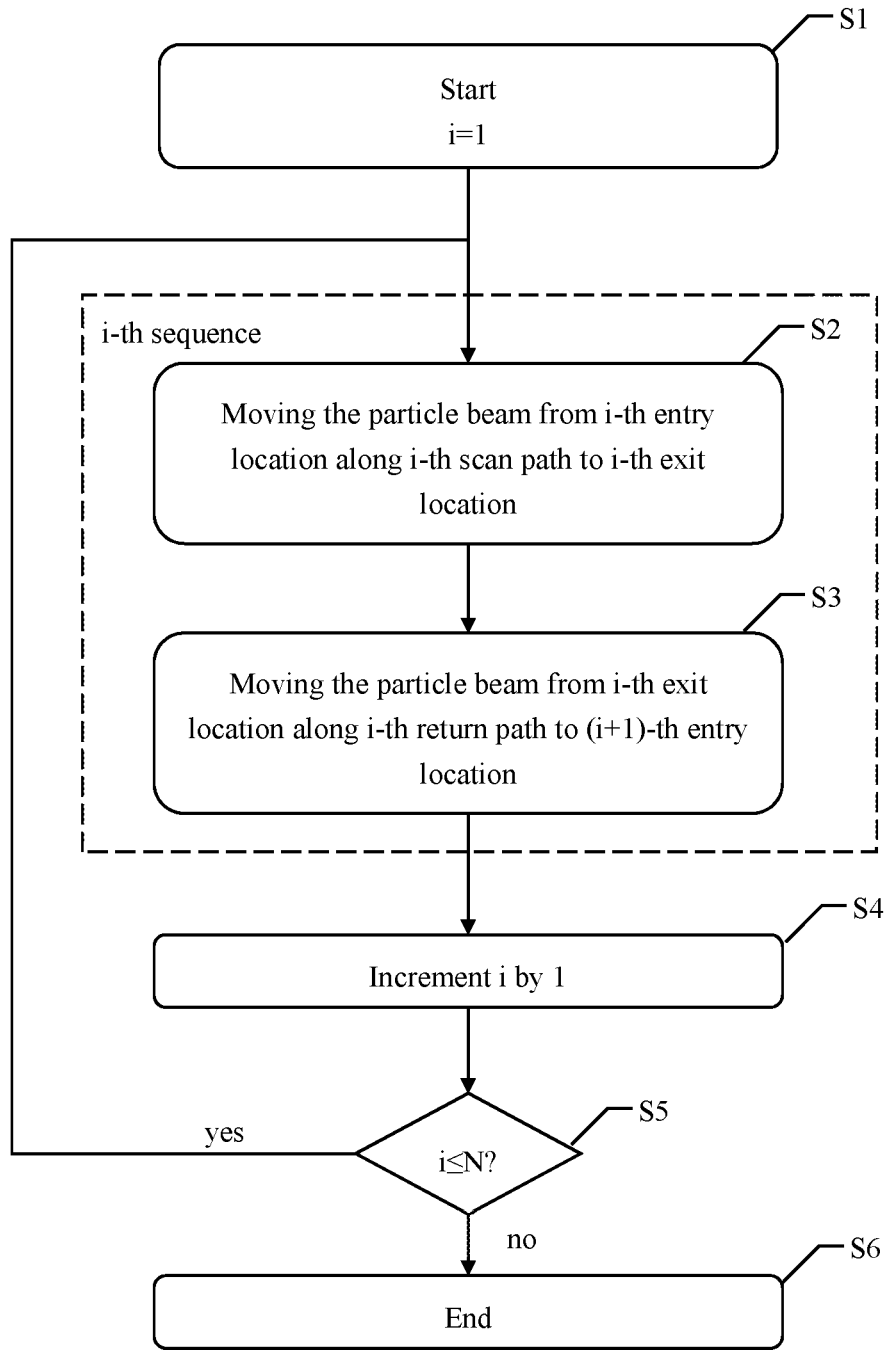
FIG. 3 shows a method of operating a particle beam system.

With reference to FIGS. 2 and 3, an exemplary method of operating the particle beam system 1 is described below. FIG. 2 shows how the particle beam 7 is moved on the surface 27 of the object 3. FIG. 3 shows a flow chart of an exemplary method of operating the particle beam system 1. It is the object of the method to analyze and/or process a region 25 of the surface 27 of the object 3. The region 25 is defined by a closed boundary line 29 shown as dash-dotted line in FIG. 2.

The method is based on a sequence which is performed repeatedly in time. In the example shown in FIG. 2, the method includes five sequences, i.e., the sequence is performed five times. This small amount of sequences is chosen only for a simplified explanation of the method. In practice, the sequence is performed more often.

The sequence includes moving the particle beam 7 from an entry location of the present sequence 31-1 to 31-5 to an exit location of the present sequence 33-1 to 33-5 along a scan path 35-1 to 35-5, wherein the entry location and the exit location are located on the boundary line 29 and wherein the scan path is located entirely inside the region 25.

The sequence further includes moving the particle beam 7 from the exit location of the present sequence 33-1 to 33-5 to an entry location of the next sequence 31-2 to 31-5, 31-1 along a return path 37-1 to 37-5, wherein the entry location of the next sequence is located on the boundary line 29 and wherein the return path is located entirely outside the region 25.

The entry location 31-1 and the exit location 33-1 are assigned to the first execution of the sequence, i.e., to the first sequence. The entry location 31-2 and the exit location 33-2 are assigned to the second execution of the sequence, i.e., to the second sequence. The entry location 31-3 and the exit location 33-3 are assigned to the third execution of the sequence, i.e., to the third sequence. The entry location 31-4 and the exit location 33-4 are assigned to the fourth execution of the sequence, i.e., to the fourth sequence. The entry location 31-5 and the exit location 33-5 are assigned to the fifth execution of the sequence, i.e., to the fifth sequence.

The scan path 35-1 of the first sequence runs from the entry location 31-1 of the first sequence to the exit location 33-1 of the first sequence. The scan path 35-2 of the second sequence runs from the entry location 31-2 of the second sequence to the exit location 33-2 of the second sequence. The scan path 35-3 of the third sequence runs from the entry location 31-3 of the third sequence to the exit location 33-3 of the third sequence. The scan path 35-4 of the fourth sequence runs from the entry location 31-4 of the fourth sequence to the exit location 33-4 of the fourth sequence. The scan path 35-5 of the fifth sequence runs from the entry location 31-5 of the fifth sequence to the exit location 33-5 of the fifth sequence.

The return path 37-1 of the first sequence runs from the exit location 33-1 of the first sequence to the entry location 31-2 of the second sequence. The return path 37-2 of the second sequence runs from the exit location 33-2 of the second sequence to the entry location 31-3 of the third sequence. The return path 37-3 of the third sequence runs from the exit location 33-3 of the third sequence to the entry location 31-4 of the fourth sequence. The return path 37-4 of the fourth sequence runs from the exit location 33-4 of the fourth sequence to the entry location 31-5 of the fifth sequence. The return path 37-5 of the fifth sequence runs from the exit location 33-5 of the fifth sequence to the entry location 31-1 of the first sequence.

The first sequence begins by directing the particle beam 7 to the entry location 31-1 of the first sequence. Beginning from the entry location 31-1 of the first sequence, the particle beam 7 is moved along the scan path 35-1 of the first sequence to the exit location 33-1 of the first sequence, wherein the first scan path is located entirely inside the region 25 defined by the boundary line 29. From the exit location 33-1 of the first sequence, the particle beam 7 is moved to the entry location of the next sequence, i.e., to the entry location 31-2 of the second sequence, wherein the particle beam 7 is moved along the return path 37-1 of the first sequence which is located entirely outside the region 25. The first sequence ends by the particle beam 7 arriving at the entry location of the next sequence, i.e., the entry location 31-2 of the second sequence.

The second, third and fourth sequence are performed analogously.

The fifth sequence begins by directing the particle beam 7 to the entry location 31-5 of the fifth sequence. From the entry location 31-5 of the fifth sequence, the particle beam 7 is moved along the scan path 35-5 of the fifth sequence to the exit location 33-5 of the fifth sequence, wherein the fifth scan path is located entirely inside the region 25 defined by the boundary line 29. From the exit location 33-5 of the fifth sequence, the particle beam 7 is moved to the entry location of the next sequence, i.e., the entry location 31-1 of the first sequence, wherein the particle beam 7 is moved along the return path 37-5 of the fifth sequence which is located entirely outside the region 25. The fifth sequence ends by the particle beam 7 arriving at the entry location of the next sequence, i.e., the entry location 31-1 of the first sequence. Because the example of the method shown in FIG. 2 includes only five executions of the sequence, the method ends after the fifth sequence. Alternatively, the method can be repeatedly performed because the particle beam is already directed to the entry location 31-1 of the first sequence again.

In the example shown in FIG. 2, the region 25 is scanned line by line wherein no further scan paths are located between the scan paths of sequences performed directly after one another. This scan strategy serves for explaining the method and plural different scan strategies can be used. For example, another scan strategy is interlaced scanning in which one or more scan paths are located between the scan paths of sequences performed directly after one another.

FIG. 3 shows a flow chart for the method described in connection with FIG. 2, wherein the method is generalized to N executions of the sequence, wherein N is a natural number. The generalized method begins in step S1 with the first execution of a sequence, i.e., the execution of the first sequence. In FIG. 3, the sequence counter "i" is used to indicate the i-th sequence and the i-th execution of the sequence, respectively.

In step S2, the particle beam 7 is moved from the i-th entry location (31-$i$) along the i-th scan path (35-$i$) to the i-th exit location (33-$i$), wherein the i-th scan path (35-$i$) is located entirely inside the region 25.

In step S3 which succeeds step S2, the particle beam 7 is moved from the i-th exit location (33-$i$) along the i-th return path (37-$i$) to the (i+1)-th entry location (31-$(i+1)$), wherein the i-th return path (37-$i$) is located entirely outside the region 25. With this, the i-th sequence ends. If i equals N in step S3, the particle beam 7 is moved from the N-th exit location (33-N) along the N-th return path (37-N) to the first entry location (31-1).

In step S4 which succeeds step S3, the sequence counter "i" is incremented by 1.

In step S5 which succeeds step S4, it is determined whether all of the N sequences to be performed were performed or not. If all of the N sequences to be performed were performed (no), the method ends in step S6. Alternatively, the method can be repeated from the beginning, i.e., continued in step S1. If not all of the N sequences were performed (yes), the method is continued in step S2.

An abort condition different from the exemplary abort condition described above can be used in step S5.

The methods described in connection with FIGS. 2 and 3 effect that particle beam 7 is moved systematically across the region 25. By detecting the secondary particles generated by interaction of the particle beam 7 with the object 3, the region 25 can be analyzed and/or processed. It is avoided that the particle beam 7 strikes the region 25 during return whereby negative influences can be avoided because the particle beam is moved to the beginning of the next scan path along the return paths 37-1 to 37-5, 37-$i$ which are located entirely outside the region 25. Therefore, it is not necessary to provide a particle beam blanker in the particle beam system 1 which effects that the particle beam does not strike the object during the return of the particle beam. Therefore, costs for the particle beam blanker can be avoided because its functionality can be achieved by the above described methods.

As illustrated in FIG. 2, each of the return paths 37-1 to 37-5 can include a return path section 39 which is included in all of the return paths 37-1 to 37-5. In the example illustrated in FIG. 2, the return path section 39 begins at a location 41 and ends at a location 43. This way, the particle beam 7 is directed to few portions of the object 3 during return whereby negative influences can be diminished.

During execution of the methods described in connection with FIGS. 2 and 3, the secondary particles 24 generated by interaction of the particle beam 7 with the object 3 can be detected. This means that the secondary particles 24 are detected for the duration of each sequence. Based on the detected secondary particles 24, a detection signal can be generated by the detector 23 wherein the detection signal represents the amount and/or energy of the detected secondary particles in dependence of time. This means that the detection signal is generated for the duration of each sequence. Based on the detection signal, data can be generated which forms the basis for the analysis and/or processing of the region 25; for example, the data represent an image of the region 25. Time-limited sections can be extracted from the detection signal continuously output by the detector 23, wherein the time-limited sections are associated with those secondary particles that were generated when the particle beam 7 was moved along a scan path 35-1 to 35-5, for example. Accordingly, these sections do not contain contributions of the detection signal that are associated with secondary particles that were generated when the particle beam 7 was moved along one of the return paths 37-1 to 37-5.

Details related to the entry locations 31-1 to 31-5 of the sequences, the exit locations 33-1 to 33-5 of the sequences and their spatial arrangement are described in connection with FIG. 4.

A double-headed arrow 45 represents a distance between the entry location 31-1 of the first sequence and the exit location 33-1 of the same sequence. In the example of FIG. 4, the distance between the entry location of a particular sequence and the exit location of the same sequence is the same for each of the sequences. However, this distance is not required to be the same for all of the sequences. Accordingly, the distance of different sequences can be different. The distance represented by the arrow 45 amounts, for at least one and at most all of the pairs of entry locations and exit locations of the same sequence, to at least 50 nm, in particular at least 100 nm or further in particular at least 200 nm, for example.

Figure 4:
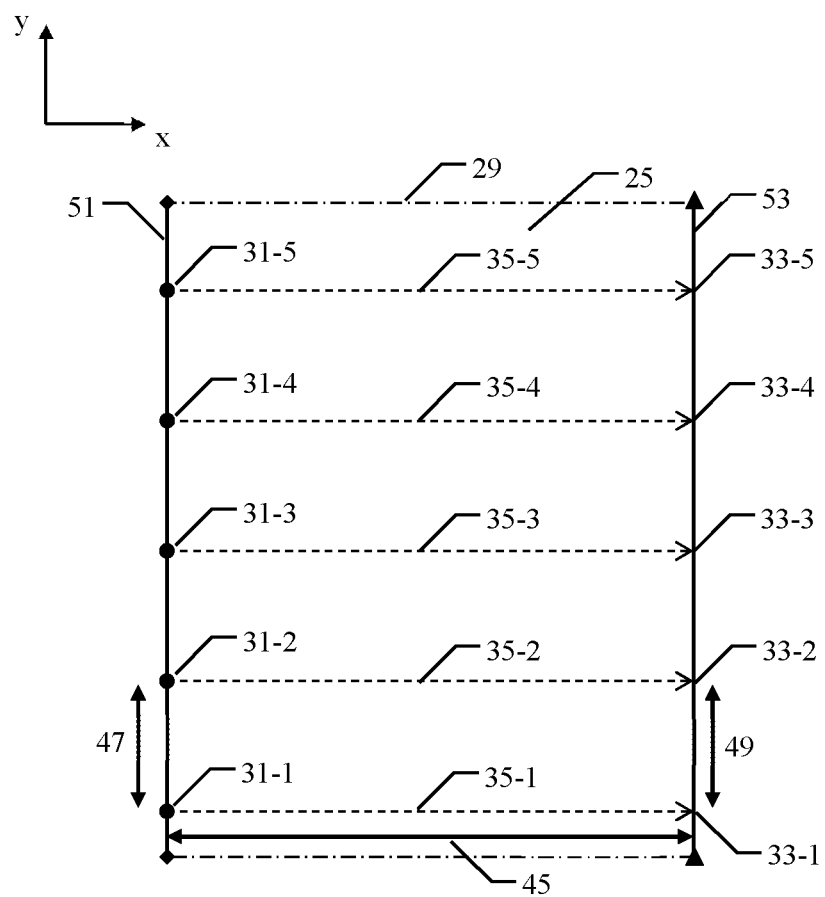
FIG. 4 shows details of the spatial relations during the moving of a particle beam across a surface of an object.

In the example shown in FIG. 4, the entry locations 31-1 and 31-2 are located on the boundary line 29 directly adjacent to each other; the entry locations 31-2 and 31-3 are located on the boundary line 29 directly adjacent to each other; the entry locations 31-3 and 31-4 are located on the boundary line 29 directly adjacent to each other; the entry locations 31-4 and 31-5 are located on the boundary line 29 directly adjacent to each other. The closer the entry locations located directly adjacent to each other on the boundary line 29 are located, the better can the region 25 be analyzed and/or processed.

An arrow 47 represents a distance between entry locations located directly adjacent to each other on the boundary line 29 (here between the entry locations 31-1 and 31-2). This distance amounts, for at least one and at most all of the pairs of entry locations located directly adjacent to each other on the boundary line 29, to at most 200 nm, in particular at most 100 nm or further in particular at most 10 nm, for example.

In the example shown in FIG. 4, the exit locations 33-1 and 33-2 are located directly adjacent to each other on the boundary line 29; the exit locations 33-2 and 33-3 are located directly adjacent to each other on the boundary line 29; the exit locations 33-3 and 33-4 are located directly adjacent to each other on the boundary line 29; the exit locations 33-4 and 33-5 are located directly adjacent to each other on the boundary line 29. The closer the exit locations located directly adjacent to each other on the boundary line 29 are located, the better can the region 25 be analyzed and/or processed.

An arrow 49 represents a distance between exit locations located directly adjacent to each other on the boundary line 29 (here between the exit locations 33-1 and 33-2). This distance amounts, for at least one and at most all of the pairs of exit locations located directly adjacent to each other on the boundary line 29, to at most 200 nm, in particular at most 100 nm or further in particular at most 10 nm, for example.

The arrows 47 and 49 have the same length in the example shown in FIG. 4. In general, the distances can have different lengths.

The boundary line 29 has a first uninterrupted section 51 indicated by a thick line having diamonds at its ends. The first uninterrupted section 51 includes all entry locations 31-1 to 31-5. The boundary line 29 has a second uninterrupted section 53 indicated by a thick line having triangles at its ends. The second uninterrupted section 53 includes all exit locations 33-1 to 33-5. The first section 51 and the second section 53 do not overlap.

The methods described herein can also be performed by the particle beam systems described with reference to FIGS. 5 and 6.

Figure 5:
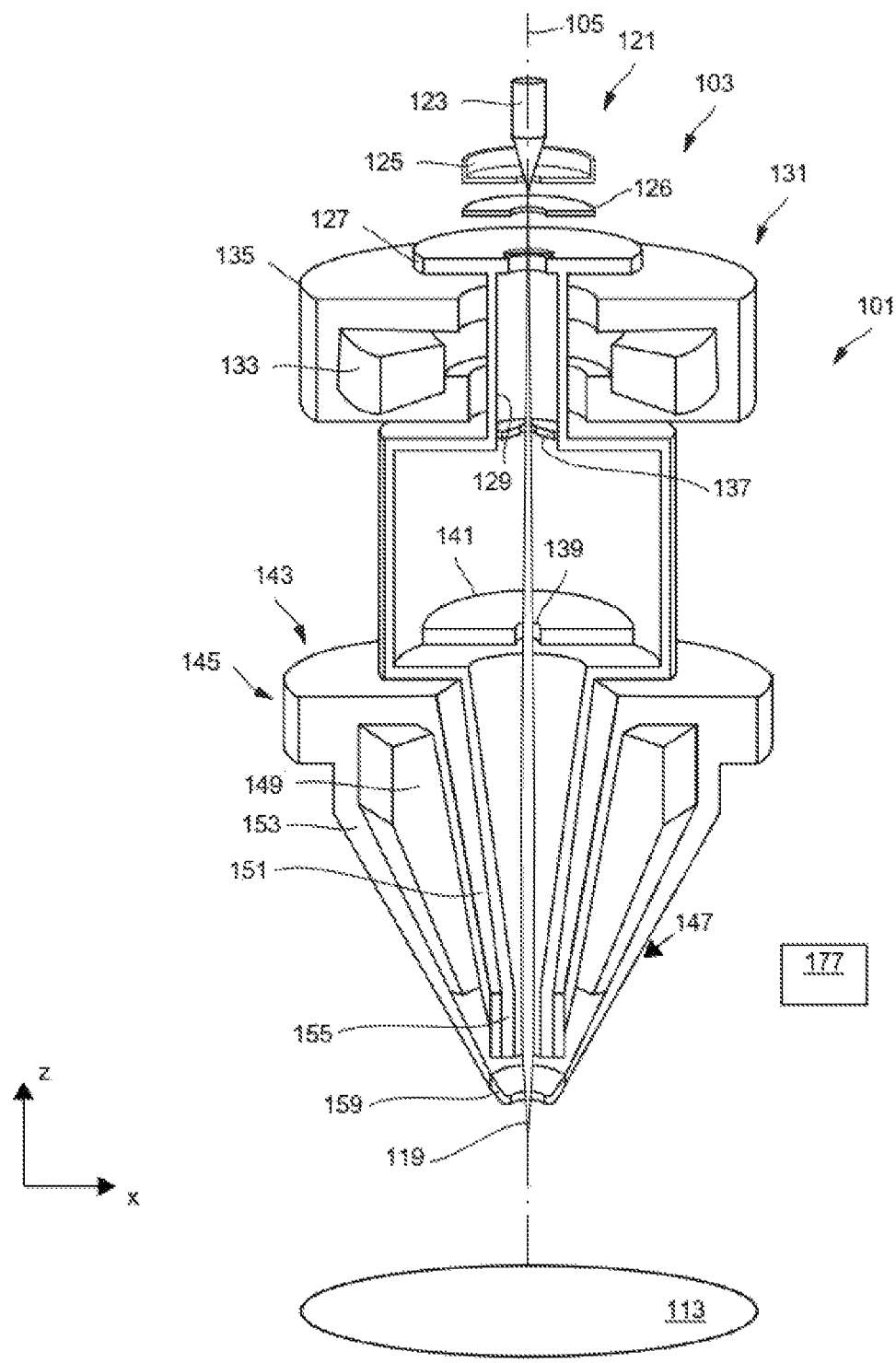
FIG. 5 shows another exemplary particle beam system, namely an scanning electron microscope.

In a perspective and schematically simplified illustration, FIG. 5 shows a particle beam system 101 including an electron microscopy system 103 having a main axis 105.

The electron microscopy system 103 is configured to generate a primary electron beam 119 which is emitted along the main axis 105 of the electron microscopy system 103 and to direct the primary electron beam 119 onto an object 113.

The electron microscopy system 103 includes, for producing the primary electron beam 119, an electron source 121, which is illustrated schematically by way of a cathode 123 and a suppressor electrode 125, and an extractor electrode 126, which is arranged at a distance therefrom. The electron microscopy system 103 furthermore includes an acceleration electrode 127 which transitions into a beam tube 129 and runs through a condenser arrangement 131, which is illustrated schematically by way of a toroidal coil 133 and a yoke 135. After the primary electron beam 119 has passed through the condenser arrangement 131, it runs through a pinhole aperture 137 and a central hole 139 in a secondary electron detector 141, whereupon the primary electron beam 119 enters an objective lens 143 of the electron microscopy system 103. The objective lens 143 includes a magnetic lens 145 and an electrostatic lens 147 for focusing the primary electron beam 119. In the schematic illustration of FIG. 5, the magnetic lens 145 includes a toroidal coil 149, an internal pole piece 151 and an external pole piece 153. The electrostatic lens 147 is formed by a lower end 155 of the beam tube 129, the internal lower end of the external pole piece 153, and a toroidal electrode 159 which tapers conically towards the object 113.

Although not illustrated in FIG. 5, the electron microscopy system 103 further includes a deflection system for deflecting the primary particle beam 119 in directions perpendicular to the main axis 105.

The particle beam system 101 furthermore includes a controller 177, which controls the operation of the particle beam system 101. The controller 177 in particular controls the operation of the electron microscopy system 103.

Figure 6:
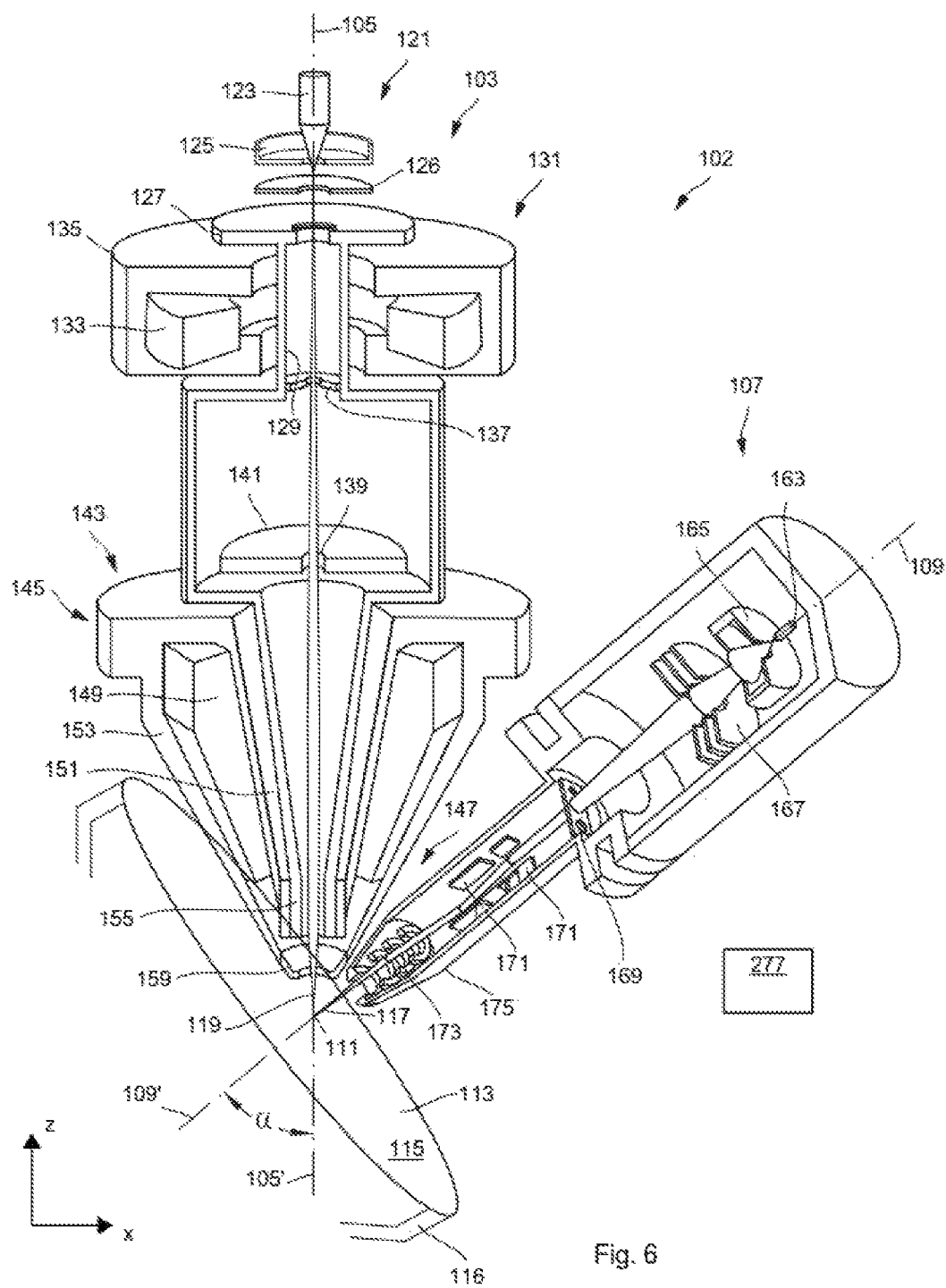
FIG. 6 shows another exemplary particle beam system, namely a scanning electron microscope combined with an ion beam column.

In a perspective and schematically simplified illustration, FIG. 6 shows a particle beam system 102 including an ion beam system 107 having a main axis 109 and the electron microscopy system 103 described above with reference to FIG. 5.

The main axes 105 and 109 of the electron microscopy system 103 and the ion beam system 107 intersect at a site 111 within a shared working region at an angle $\alpha$, which can have a value of for example 45° to 55° or about 90°, with result that an object 113 to be analyzed and/or processed having a surface 115 can both be processed in a region of the site 111 using an ion beam 117 which is emitted along the main axis 109 of the ion beam system 107 and be analyzed using an electron beam 119 which is emitted along the main axis 105 of the electron microscopy system 103. For holding the object 113, a schematically indicated holder 116 is provided, which can adjust the object 113 with respect to its distance from and orientation with respect to the electron microscopy system 103 and the ion beam system 107.

The ion beam system 107 includes an ion source 163 having an extraction electrode 165, a condenser 167, a stop 169, deflection electrodes 171 and a focusing lens 173 for producing the ion beam 117 which exits a housing 175 of the ion beam system 107. The longitudinal axis 109' of the holder 116 is inclined with respect to the vertical 105' by an angle which in this example corresponds to the angle α between the main axes 105 and 109. However, the directions 105' and 109' do not need to coincide with the main axes 105 and 109, and the angle they enclose does not have to match the angle α between main axes 105 and 109.

The particle beam system 102 furthermore includes the controller 277, which controls the operation of the particle beam system 102. The controller 277 in particular controls the operation of the electron microscopy system 103, the ion beam system 107 and the holder 116.

What is claimed is:

1. A method, comprising:
using a particle beam microscope to repeat a sequence to move a particle beam across a surface of an object, the surface of the object comprising a region defined by a virtual closed boundary line,
wherein the sequence comprises:
moving the particle beam from an entry location of a present sequence to an exit location of the present sequence along a scan path, the entry location of the present sequence and the exit location of the present sequence being located on the virtual closed boundary line, and the scan path being located entirely inside the region of the surface of the object; and
moving the particle beam from the exit location of the present sequence to an entry location of a next sequence along a return path, the entry location of the next sequence being located on the virtual closed boundary line, and the return path being located entirely outside the region of the surface of the object.

2. The method of claim 1, wherein the particle beam continuously strikes the surface of the object for the duration of each sequence.

3. The method of claim 1, wherein, for each return path, the return path comprises a return path section included in all of the return paths.

4. The method of claim 3, wherein, for each return path, a length of the return path section is at least 30% of a length of a shortest return path.

5. The method of claim 3, wherein, for each return path, a length of the return path section is at least 30% of a length of a shortest scan path of the sequences.

6. The method of claim 1, wherein the region of the surface of the object is rectangular.

7. The method of claim 1, wherein the region of the surface of the object has an area of at least 100 nm$^2$.

8. The method of claim 1, wherein, for at least one of the sequences, a distance between the entry location of the sequence and the exit location of the sequence is at least 50 nm.

9. The method of claim 1, wherein, for entry locations located directly adjacent each other on the virtual closed boundary line, a distance between the entry locations is at most 200 nm.

10. The method of claim 1, wherein, for exit locations located directly adjacent each other on the virtual closed boundary line, a distance between the exit locations is at most 200 nm.

11. The method of claim 1, wherein:
the virtual closed boundary line comprises first and second uninterrupted sections;
the first and second uninterrupted sections do not overlap;
the first uninterrupted section comprises the entry location of the present sequence and the entry location of the next sequence; and
the second uninterrupted section comprises the exit location of the present sequence and the exit location of the next sequence.

12. The method of claim 1, wherein the scan paths are substantially straight lines.

13. The method of claim 1, wherein a mean value of the lengths of the scan paths is less than a mean value of the lengths of the return paths.

14. The method of claim 1, further comprising:
defining the region of the surface of the object;
generating control signals for a deflection system of the particle beam microscope based on the defined region of the surface of the object; and
using the deflection system to move the particle beam.

15. The method of claim 1, further comprising:
detecting secondary particles generated by interaction of the particle beam with the object; and
generating a detection signal representing at least one parameter selected from the group consisting of an amount of the detected secondary particles in dependence of time and an energy of the detected secondary particles in dependence of time.

16. The method of claim 15, further comprising generating data representing an image of the region of the surface of the object based on the detection signal.

17. The method of claim 1, wherein:
for at least some of the scan paths, when the particle beam moves along the scan path, the particle beam rests at a plurality of rest locations; and
for each rest location, the particle beam rests for a predetermined rest duration.

18. The method of claim 1, wherein the particle beam is continuously moved when moving the particle beam along the scan paths.

19. One or more machine-readable hardware storage devices comprising instructions that are executable by one or more processing devices to perform operations comprising the method of claim 1.

20. A system comprising:
one or more processing devices; and
one or more machine-readable hardware storage devices comprising instructions that are executable by the one or more processing devices to perform the method of claim 1.

* * * * *